Figure 1:
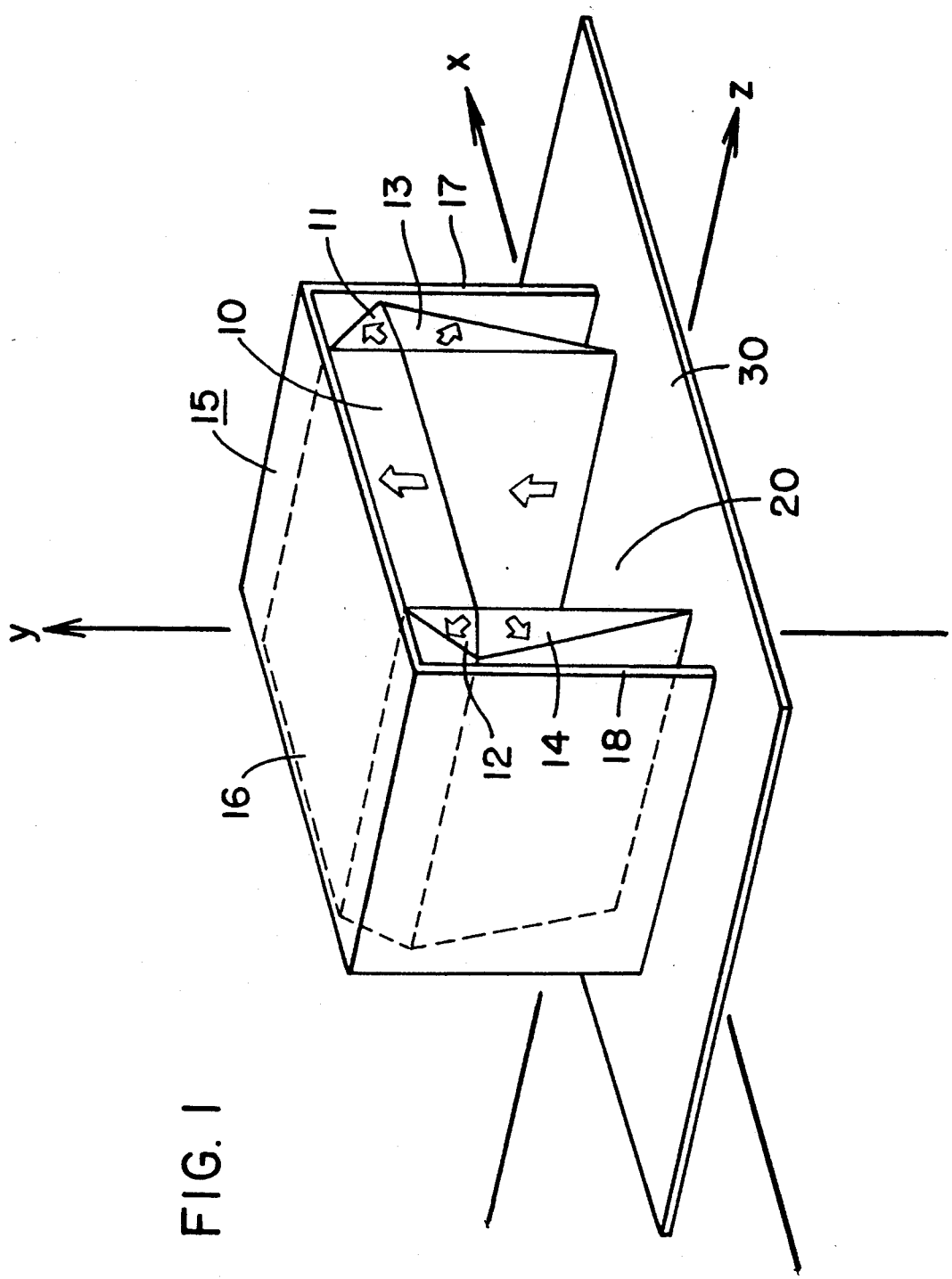

United States Patent [19]
Abele et al.

[11] Patent Number: 5,278,534
[45] Date of Patent: Jan. 11, 1994

[54] MAGNETIC STRUCTURE HAVING A MIRROR

[75] Inventors: Manlio G. Abele, New York; Henry Rusinek, Great Neck, both of N.Y.

[73] Assignee: New York University, New York, N.Y.

[21] Appl. No.: 938,849

[22] Filed: Sep. 1, 1992

[51] Int. Cl.⁵ .............................................. H01F 7/02
[52] U.S. Cl. ................................. 335/306; 335/301; 335/304
[58] Field of Search ........................... 335/296; 335/14

[56] References Cited

U.S. PATENT DOCUMENTS

| | | | |
|---|---|---|---|
| 2,832,932 | 4/1958 | Baermann | 335/306 |
| 3,227,931 | 1/1966 | Adler | 335/306 |
| 3,768,054 | 10/1973 | Neugebauer | 335/304 |
| 4,456,898 | 6/1984 | Frischmann | 335/217 |
| 4,835,506 | 5/1989 | Leupold | 335/306 |
| 4,859,976 | 8/1989 | Leupold | 335/306 |
| 4,861,752 | 8/1989 | Leupold | 335/306 |

Primary Examiner—Leo P. Picard
Assistant Examiner—Raymond Barrera
Attorney, Agent, or Firm—Rosen, Dainow & Jacobs

[57] ABSTRACT

A magnetic structure defining a cavity includes a first member of high-permeability material having a flat surface defining a first wall of the cavity, and a member of permanent magnetic material spaced from the flat surface and producing a uniform magnetic field in the cavity. The permanent magnetic material member may have two or more layers, with the layers outward of the cavity being of a material having a remanence that is no greater than the adjacent inner layers.

7 Claims, 2 Drawing Sheets

MAGNETIC STRUCTURE HAVING A MIRROR

FIELD OF THE INVENTION

This invention is directed to the provision of a magnetic structure for producing a uniform field in a cavity. While the invention is especially adapted for use in NMR imaging, it is not limited to this field of application.

BACKGROUND OF THE INVENTION

NMR breast imaging, for example, can be performed with whole body scanners by positioning the region of interest on the chest wall near the center of the imaging region. In traditional scanners, the imaging region is usually defined as a quasi-spherical volume, concentric with the center of the scanner, where the field satisfies the uniformity levels dictated by the diagnostic requirements. If such a scanner is used for breast imaging, the off-center position of the body results in a very inefficient use of a scanning instrument whose cavity has been designed to be large enough to accommodate the whole body of a patient.

In principle, any magnet can be designed to generate a field whose center is arbitrarily chosen within its cavity. Usually a shift of the center of the field away from the geometrical center of the cavity results in a lower figure of merit, i.e. more energy is required to generate the same field. If the magnet cavity were closed, the shifting of the field center would not necessarily affect the uniformity of the field. In a practical situation, however, if the cavity must be open, the figure of merit and the uniformity of the field both deteriorate rapidly as the field center approaches the magnet opening. In order to maintain the same value of the field and the same dimension of the imaging region, the size of the magnet must consequently be increased.

An example of this phenomena is a flat bed superconductive magnet where the coil system is below a flat platform 3.9 meters in diameter and the imaging region is above the platform at about 15 cm from its surface. The stray field of such a magnet is quite large, with the 5 Gauss line at more than 10 meters from the center of the structure when the field within the imaging region is 0.2 T (See "New Magnet Designs for MR", D. Hawksworth. Magnetic Resonance in Medicine, Vol. 9, pp 27–32, 1991)

SUMMARY OF THE INVENTION

Briefly stated, the present invention is directed to the provision of a magnetic structure defining a cavity. The structure includes a first member of high-permeability material having a flat surface defining a first wall of the cavity, and a member of permanent magnetic material spaced from the flat surface and producing a uniform magnetic field in the cavity. The permanent magnetic material member may have two or more layers, with the layers outward of the cavity being of a material having a remanence that is no greater than the adjacent inner layers.

BRIEF FIGURE DESCRIPTION

Figure 2:
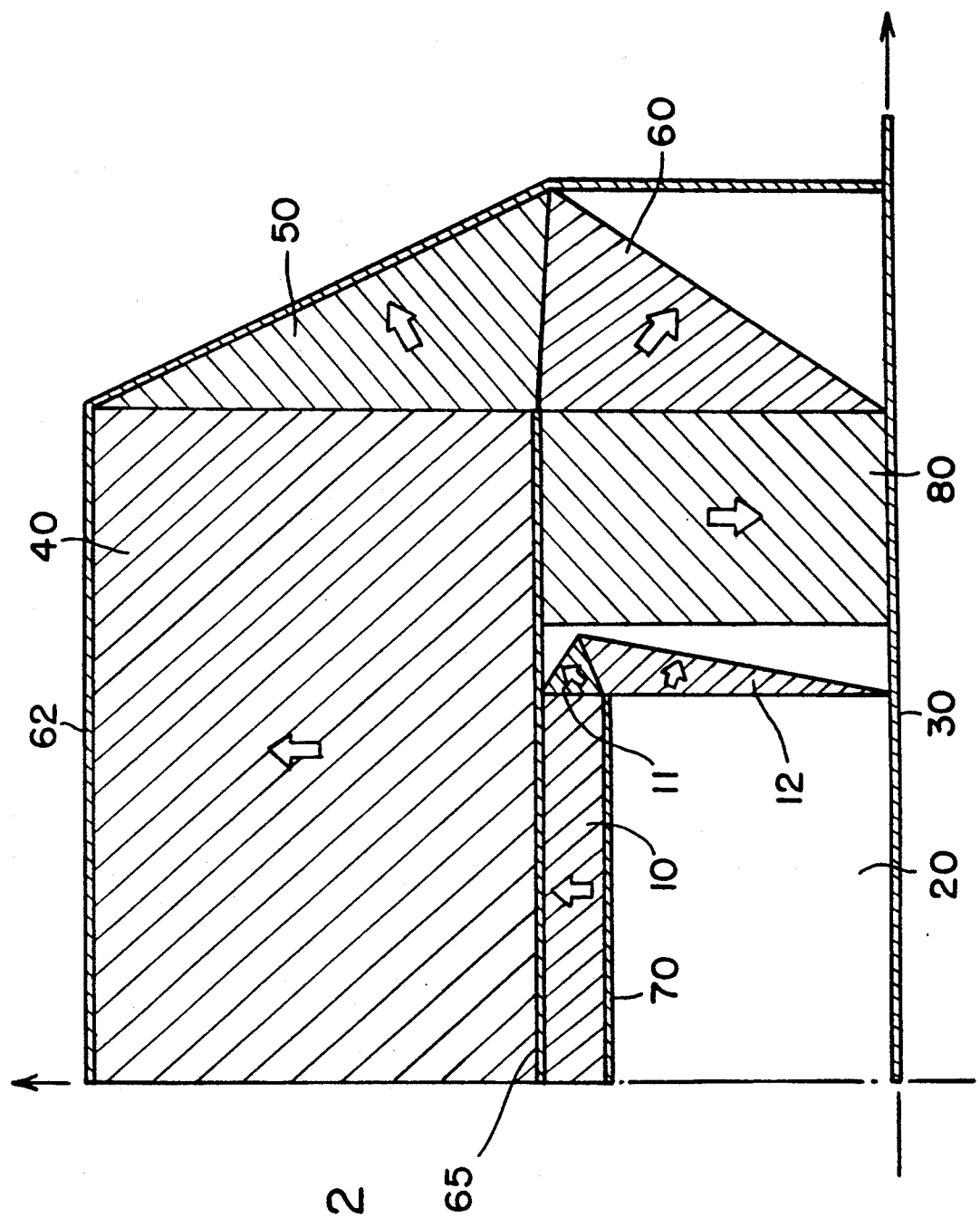

In order that the invention may be more clearly understood, it will now be disclosed in greater detail with reference to the accompanying drawings, wherein:

FIG. 1 is a perspective view of one embodiment of a magnetic structure in accordance with the invention; and FIG. 2 is a cross sectional view of a quadrant of a modification of the magnetic structure of FIG. 1.

DETAILED DISCLOSURE OF THE INVENTION

In accordance with the invention, as illustrated in FIG. 1, a magnetic structure is comprised of a high strength permanent magnet 10 facing a rectangular cavity 20. For example, the permanent magnet may be comprised of a high strength magnetic material such as an Nd.Fe alloy. A triangular cross section magnetic element 11 is positioned with one side thereof abutting one side of the magnet 10, and a triangular cross section magnetic element 12 is positioned with one side thereof abutting the opposite side of the magnet 10. A further triangular cross section magnetic element 13 is positioned with one side abutting a side of the magnetic element 11 and another side defining a second side of the cavity. A still further triangular cross section magnetic element 14 is positioned with one side abutting a side of the magnetic element 12 and another side defining a third side of the cavity. The magnetic elements of the structure illustrated in FIG. 1 may be designed in accordance with copending U.S. patent application Ser. No. 707,620 filed May 30, 1991, now U.S. Pat. No. 5,162,771 issued Nov. 10, 1992 (Case NYU127A) and assigned to the present assignee, the contents of which are incorporated herein by reference, with the exception that the magnetic structure of the present invention extends only on one side of the axis of the structure defined in the copending application.

The structure illustrated in FIG. 1 may have a yoke 15. In accordance with the disclosure of the above copending application Ser. No. 707,620, the yoke may have a portion 16 abutting the side of the magnet 10 opposite the cavity, and portions 17 and 18 extending at right angles from the ends of yoke portion 16 to the plane of the remaining side of the cavity 20. The yoke portions 17, 18 may be spaced from the exterior sides of the triangular cross section magnetic elements 11–14.

It will be understood, of course, that the invention is not limited to a magnetic structure of the above type, it only being necessary to provide a magnetic structure defining three sides of a rectangular cavity, and producing a uniform magnetic flux in the cavity and directed normal to the plane of the open side of the cavity.

In accordance with the invention, the fourth side of the rectangular cavity is closed by an element 30, such as a plate of high permeability material. For the purposes of this invention, it is understood that the term "high permeability" refers to a material having a permeability greater than 10. It is of course apparent that the element 30 may be of other shapes, as long as it has a flat side facing the cavity 20. This element 30 constitutes a high permeability "mirror" for the magnetic field. Due to the presence of the mirror, the imaging region in the cavity, when the cavity is employed in NMR applications, is approximately half a spheroid having a center at the mirror surface and its smaller dimension perpendicular to the mirror. The arrangement of FIG. 1 thereby eliminates half of the magnetic material that would be required, as in a conventional magnetic structure, if the imaging region were a full spheroid.

The half spheroid imaging region provided by the arrangement of FIG. 1 is better suited for some imaging operations than the conventional structures. It is especially suited for imaging partial body imaging, such as, for example, for NMR breast imaging for mammography, in which case the patient is positioned face down in the cavity with chest walls against or close to the mirror. This arrangement enables a substantial reduction in the size of the magnet for the reason that the lower half of conventional structures is omitted.

The bore size of the magnet is dictated primarily by the body cross-section, when an NMR magnet is employed for full-body imaging. Since, in the arrangement in accordance with the invention, the back of the patient is outside of the imaging region, the clearance between the body and the upper surface of the magnet cavity can be reduced to a minimum compatible with the insertion of the conventional gradient and RF coils (not illustrated). The resultant cost saving can also be quite substantial, since it enables a reduction in the volume of rare-earth alloys that are conventionally employed in such magnets.

In the arrangement of FIG. 1, it is preferred that the magnet 10 and the triangular cross section elements 11–14 be of a material such as a rare-earth alloy. The volume of rare-earth material that is required can be minimized, however, by employing techniques such as disclosed in copending patent application Ser. No. 909,143 filed Jul. 6, 1992 (Case NYU130) and assigned to the present assignee, the contents of which are incorporated herein by reference. Thus, as illustrated in FIG. 2, a multi-layer arrangement enables the obtaining of a medium field strength at a much lower cost than for a single layer design. The optimum design for a 0.4 Tesla field consists of a two layer design where the internal layer 10, 11, 12 is a Nd.Fe.B alloy, designed in accordance with the disclosure of copending application Ser. No. 707,620 and the external layer 40, 50, 60 is of ferrite having a lower remanence than that of the inner layer, in accordance with copending application Ser. No. 909,143. The outer layer includes a ferrite element 40 generally parallel to the element 10, a triangular section 50 abutting the ends of the section 40, and a further triangular section 60 extending between the section 50 and the mirror 30. In the illustrated structure, both the inner layer and the outer layer are hybrid structures, each designed to generate a 0.2 Tesla field within the rectangular cavity. The external heavy line 62 denotes a yoke whose function is to close the flux generated by the ferrite layer only.

FIG. 2 also illustrates a partial yoke 65 that separates the Nd.Fe.B layer from the ferrite structure and a high permeability plate 70 at the interface between the Nd.Fe.B structure and the cavity. The plate 70 is designed to filter out the spatial high frequency components of the magnetization tolerances. Other filter components and shimming elements are not shown.

In addition, FIG. 2 illustrates the provision of shunt 80 of magnetic material, for example of ferrite, extending between the yoke 65 and the mirror element 30. This shunt, as disclosed in copending application Ser. No. 909,143, enables further reductions in the required amount of high strength magnetic material in the magnetic structure.

Two essential features of the arrangement of FIG. 2 are:

1. Due to the relative small vertical dimension of the imaging region relative to the height of the cavity (of the order of 0.2), a high degree of field uniformity is more readily obtainable than in a conventional whole body scanner, wherein the ratio of the same two dimensions is of the order of 0 5.

2. The presence of the magnetic mirror makes the final shimming of the magnetic structure as effective as if it were implemented on a closed surface totally enclosing the imaging region because the mirror images also the shimming components distributed on the inside surface of the magnetic structure.

The magnet structure in accordance with the invention has the following advantages:

1. A double layer design using a lower energy product material for an external layer makes it economically feasible to generate a 0.4 T field with the magnet structure of the invention.

2. A hybrid design for each layer of such a structure assures an efficient use of material.

3. The closing of the flux of the internal layer via a low energy product material further reduces the cost of the structure.

4. The magnetic mirror places the imaging region on the lower horizontal side of the magnet cavity, thereby better adapting the magnetic structure to some types of imaging, such as chest wall imaging.

5. Shimming of the magnetic structure of the invention involves only the harmonics that are symmetric with respect to the mirror.

While the invention has been disclosed and described with reference to a limited number of embodiments, it will be apparent that variations and modifications may be made therein, and it is intended in the following claims to cover each such variation and modification as falls within the true spirit and scope of the inventions.

What is claimed is:

1. A magnetic structure having a uniform magnetic field comprising an element of high-permeability material having a flat surface, an element of permanent magnetic material having a surface spaced from and facing said flat surface, said flat surface and surface of said magnetic material defining opposed walls of a rectangular cross section cavity, said magnetic structure comprising further members defining a pair of further opposed walls of said cavity, said element of permanent magnetic material and further members producing a uniform magnetic field in said cavity.

2. The magnetic structure of claim 1 wherein said surface of said permanent magnetic material is flat and parallel to said flat surface.

3. The magnetic structure of claim 1 wherein said element of permanent magnetic material comprises a first layer of permanent magnetic material adjacent said cavity and having a first remanence, and a second layer of permanent magnetic material separated from said cavity by said first layer, the magnetic material of said second layer having a lower remanence than said first remanence.

4. A magnetic construction having a rectangular cross section cavity with a uniform magnetic field therein, comprising an element of high-permeability material having a flat surface and positioned to define one wall of said cavity, and a magnetic structure at least partly of permanent magnetic material defining three further walls of said cavity, said magnetic structure having a surface spaced from said flat surface of said element of high permeability material, said flat surface and the surface of said structure of magnetic material defining opposed walls of said cavity.

5. The magnetic construction of claim 4 wherein said magnetic structure comprises a first magnetic member of rectangular cross section defining said surface of said magnetic structure and having opposed ends, and a plurality of second magnetic members of triangular cross section extending between said ends of said first member and said flat surface.

6. The magnetic construction of claim 4 further comprising a partial yoke on said magnetic structure and spaced from said flat surface, and a magnetic shunt of a magnetic material of remanence lower than that of said magnetic structure extending between said yoke and said flat surface.

7. The magnetic construction of claim 4 further comprising a layer of magnetic material surrounding said magnetic structure on the sides thereof external of said cavity, said layer extending to said flat surface and being comprised of a magnetic material of lower remanence than that of said magnetic structure.

* * * * *